(12) United States Patent
Nguyen et al.

(10) Patent No.: US 8,440,479 B2
(45) Date of Patent: May 14, 2013

(54) METHOD FOR FORMING AN ORGANIC LIGHT EMITTING DIODE DEVICE

(75) Inventors: Kelvin Nguyen, Corning, NY (US);
Butchi R. Vaddi, Painted Post, NY (US);
Lu Zhang, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 409 days.

(21) Appl. No.: 12/749,637

(22) Filed: Mar. 30, 2010

(65) Prior Publication Data

US 2010/0304513 A1 Dec. 2, 2010

Related U.S. Application Data

(60) Provisional application No. 61/181,796, filed on May 28, 2009.

(51) Int. Cl.
| H01L 51/50 | (2006.01) |
| H01L 21/312 | (2006.01) |
| H01J 1/62 | (2006.01) |
| B23B 17/00 | (2006.01) |

(52) U.S. Cl.
USPC ............ 438/29; 438/27; 438/82; 438/99; 313/512; 501/15; 501/21; 501/152

(58) Field of Classification Search .................. None
See application file for complete search history.

(56) References Cited

U.S. PATENT DOCUMENTS

| 4,238,704 A | 12/1980 | Bonk et al. ............... 313/113 |
| 6,113,450 A | 9/2000 | Narayanan et al. .......... 445/25 |
| 6,126,505 A | 10/2000 | Narayanan et al. .......... 445/25 |
| 6,129,603 A | 10/2000 | Sun et al. .................. 445/25 |
| 6,506,699 B1 | 1/2003 | Shindo et al. .............. 501/7 |
| 6,521,556 B2 | 2/2003 | Shindo et al. .............. 501/4 |
| 6,555,025 B1 | 4/2003 | Krupetsky et al. ............ 252/512 |
| 6,936,963 B2 | 8/2005 | Langer et al. .............. 313/509 |
| 6,998,776 B2 | 2/2006 | Aitken et al. .............. 313/512 |
| 7,040,121 B2 | 5/2006 | Canale et al. .............. 65/34 |
| 7,344,901 B2 | 3/2008 | Hawtof et al. .............. 438/26 |
| 7,371,143 B2 | 5/2008 | Becken et al. .............. 445/25 |
| 7,393,257 B2 | 7/2008 | Spencer et al. .............. 445/23 |
| 7,407,423 B2 | 8/2008 | Aitken et al. .............. 445/25 |
| 7,425,166 B2 | 9/2008 | Burt et al. ................... 445/25 |
| 7,473,152 B1 | 1/2009 | Ludwig et al. .............. 445/25 |

(Continued)

FOREIGN PATENT DOCUMENTS

| JP | 10-74583 | 3/1998 |
| JP | 10-228014 | 8/1998 |

*Primary Examiner* — Zandra Smith
*Assistant Examiner* — Pamela E Perkins
(74) *Attorney, Agent, or Firm* — Kevin M. Able (57) ABSTRACT

A method for sealing an organic light emitting diode (OLED) device is disclosed wherein the OLED device comprises a color filter. A color filter is deposited on a first glass plate or substrate and a glass-based frit is then deposited in a loop around the color filter. The deposited fit loop is then heated by electromagnetic energy to evaporate organic constituents and to sinter the fit in a pre-sintering step. An OLED device may then be assembled by positioning a second glass plate comprising an organic light emitting material deposited thereon in overlying registration with the first glass plate, with the color filer and the organic light emitting material positioned between the plates. The fit is then heated with a laser to form a hermetic seal between the first and second glass plates.

20 Claims, 4 Drawing Sheets

U.S. PATENT DOCUMENTS

| | | | |
|---|---|---|---|
| 7,537,504 B2 | 5/2009 | Becken et al. | 445/25 |
| 7,595,854 B2 | 9/2009 | Sung et al. | 349/139 |
| 7,597,603 B2 | 10/2009 | Becken et al. | 445/24 |
| 7,602,121 B2 | 10/2009 | Aitken et al. | 313/512 |
| 7,641,976 B2 | 1/2010 | Lamberson et al. | 428/428 |
| 7,652,305 B2 | 1/2010 | Chatterjee et al. | 257/99 |
| 7,656,088 B2 | 2/2010 | Lee et al. | 313/512 |
| 2002/0045527 A1 | 4/2002 | Shindo et al. | 501/4 |
| 2004/0083760 A1 | 5/2004 | Canale et al. | 65/34 |
| 2004/0206953 A1 | 10/2004 | Morena et al. | 257/40 |
| 2004/0207314 A1 | 10/2004 | Aitken et al. | 313/504 |
| 2005/0001545 A1 | 1/2005 | Aitken et al. | 313/512 |
| 2005/0151151 A1 | 7/2005 | Hawtof et al. | 257/100 |
| 2006/0009109 A1 | 1/2006 | Aitken et al. | 445/24 |
| 2006/0082298 A1 | 4/2006 | Becken et al. | 313/512 |
| 2006/0084348 A1 | 4/2006 | Becken et al. | 445/25 |
| 2006/0283546 A1 | 12/2006 | Tremel et al. | 156/291 |
| 2006/0284556 A1* | 12/2006 | Tremel et al. | 313/512 |
| 2007/0001591 A1* | 1/2007 | Tanaka | 313/504 |
| 2007/0007894 A1 | 1/2007 | Aitken et al. | 313/512 |
| 2007/0096631 A1 | 5/2007 | Sung et al. | 313/498 |
| 2007/0128965 A1 | 6/2007 | Burt et al. | 445/25 |
| 2007/0128966 A1 | 6/2007 | Becken et al. | 445/25 |
| 2007/0128967 A1 | 6/2007 | Becken et al. | 445/25 |
| 2007/0170855 A1 | 7/2007 | Choi et al. | 313/512 |
| 2007/0188757 A1 | 8/2007 | Amsden et al. | 356/401 |
| 2007/0252526 A1 | 11/2007 | Aitken et al. | 313/512 |
| 2008/0048556 A1 | 2/2008 | Logunov et al. | 313/504 |
| 2008/0054796 A1 | 3/2008 | Sung et al. | 313/504 |
| 2008/0106194 A1 | 5/2008 | Logunov et al. | 313/512 |
| 2008/0124558 A1 | 5/2008 | Boek et al. | 428/427 |
| 2008/0143247 A1 | 6/2008 | Kim et al. | 313/504 |
| 2008/0168801 A1 | 7/2008 | Danielson et al. | 65/32.2 |
| 2008/0206925 A1 | 8/2008 | Chatterjee et al. | 438/106 |
| 2008/0239637 A1 | 10/2008 | Sung et al. | 361/681 |
| 2008/0265770 A1 | 10/2008 | Seon et al. | 313/556 |
| 2008/0297042 A1 | 12/2008 | Ahn et al. | 313/504 |
| 2009/0009063 A1 | 1/2009 | Botelho et al. | 313/504 |
| 2009/0015136 A1 | 1/2009 | Lee et al. | 313/503 |
| 2009/0044496 A1 | 2/2009 | Botelho et al. | 53/477 |
| 2009/0051274 A1 | 2/2009 | Hayashi et al. | 313/504 |
| 2009/0066232 A1 | 3/2009 | Koo et al. | 313/504 |
| 2009/0066242 A1 | 3/2009 | Koo | 313/506 |
| 2009/0069164 A1 | 3/2009 | Lamberson et al. | 501/15 |
| 2009/0086325 A1 | 4/2009 | Liu et al. | 359/599 |
| 2009/0096716 A1 | 4/2009 | Jeong et al. | 345/55 |
| 2009/0133807 A1 | 5/2009 | Amsden et al. | 156/105 |
| 2009/0218253 A1 | 9/2009 | Nguyen et al. | 206/701 |
| 2009/0218320 A1 | 9/2009 | Wang | 219/50 |
| 2009/0218932 A1 | 9/2009 | Wang | 313/504 |
| 2009/0221207 A1 | 9/2009 | Russell et al. | 445/25 |
| 2009/0229745 A1 | 9/2009 | Lee et al. | 156/272.8 |
| 2009/0295277 A1 | 12/2009 | Logunov et al. | 313/504 |
| 2009/0297861 A1 | 12/2009 | Banks et al. | 428/428 |
| 2009/0297862 A1* | 12/2009 | Boek et al. | 428/428 |

* cited by examiner

METHOD FOR FORMING AN ORGANIC LIGHT EMITTING DIODE DEVICE

CLAIMING BENEFIT OF PRIOR FILED U.S. APPLICATION

This application claims the benefit of U.S. Application Ser. No. 61/181,796, filed on May 28, 2009. The content of this document and the entire disclosure of publications, patents, and patent documents mentioned herein are incorporated by reference.

TECHNICAL FIELD

This invention is directed to a method of forming an organic light emitting diode device, and in particular, pre-sintering a glass-based fit onto a cover glass plate comprising a color filter material disposed thereon.

BACKGROUND

Organic light emitting diode (OLED) devices are an emerging technology for display applications, and are only now advancing to dimensions exceeding those found in such common devices as cell phones. As such, they are still expensive to produce. Typically, OLED displays incorporate diodes that emit at different wavelengths (colors). One approach for reducing manufacturing costs is to produce a display that emits at a single color (white), and using color filters to express the colors needed to produce a full color display, similar to the approach taken for the more mature liquid crystal display technologies. Alternatively, color filters may be used with color producing OLEDs (e.g. RGB output) to adjust the colors emitted by the display.

One difficulty associated with OLED devices, such as OLED-based displays, is the need to maintain a hermetically sealed environment for the organic light emitting materials used for the OLEDs. This arises because the organic materials quickly degrade in the presence of even minute amounts of oxygen or moisture. To that end, a glass seal may be provided by a glass-based frit material that seals two glass plates together, provides sufficient hermeticity to the organic materials contained within the resulting package. Such glass packages have proven to be far superior to adhesive-sealed devices. In a typical frit sealed configuration, the glass-based frit is deposited on a first glass plate, referred to as the cover plate, in the form of a closed loop. The frit is deposited as a paste that is subsequently heated in a furnace for a period of time and at a temperature sufficient to at least partially sinter (pre-sinter) the frit in place on the cover plate, making later assembly of the display easier. The OLED is then deposited on a second glass plate, generally referred to as the backplane plate or simply backplane. The OLED may contain, for example, electrode materials, organic light emitting materials, hole injection layers, and other constituent parts as necessary. Generally, the two plates are then brought into alignment and the pre-sintered frit is heated with a laser that softens the frit and forms a hermetic seal between the two glass plates.

OLED display devices that incorporate a color filter may include the color filter on the cover plate, thereby making the process described above impractical, as the high furnace temperature applied to the cover and frit during the pre-sintering portion of the process is likely to destroy the color filter elements.

SUMMARY

In one embodiment, a method of forming an organic light emitting diode device is disclosed comprising depositing a color filter on a first glass plate, the color filter comprising dyes or pigments that produce a primary color in the color filter, depositing a glass-based fit on the first glass plate as a loop circumscribing the color filter and irradiating the glass-based frit with electromagnetic radiation to densify the glass-based fit on the first glass plate. The method may further comprise heating the frit prior to the irradiating step to remove organic binders in the frit without densifying the frit glass. Heating prior to the irradiating step can be achieved, for example, by heating the first glass plate on a heated support, such as a support plate or pad. The irradiation step may comprise irradiating the glass-based frit with light from a laser, from an IR lamp or with microwaves.

The method may further comprise depositing an organic light emitting material on a second glass plate, aligning the first glass plate with the second glass plate in an overlapping relationship, and heating the glass-based frit with a laser to soften the glass-based frit and form a hermetic seal between the first and second glass plates, wherein the color filter and the organic light emitting material are enclosed between the first and second glass substrates and the glass-based frit.

In another embodiment, a method of forming an organic light emitting diode device is described comprising, depositing a color filter on a first glass plate, depositing a glass-based frit on the first glass plate as a loop circumscribing the color filter, depositing an organic light emitting material on a second glass plate, irradiating the glass-based fit with electromagnetic radiation to densify the glass-based fit on the first glass plate, aligning the first glass plate with the second glass plate in an overlapping relationship, and heating the glass-based fit with a laser to soften the glass based frit and form a hermetic seal between the first and second glass plates, wherein the color filter and the organic light emitting material are enclosed between the first and second glass substrates and the glass-based frit.

The electromagnetic radiation in the irradiating step may, for example, be light energy comprising a wavelength between about 500 nm and 1200 nm. The light energy may be coherent light emitted from a laser, or broadband light emitted from a lamp. Preferably, a width of a laser beam, if used to irradiate the frit, is greater than a width of the glass-based frit. Alternatively, the electromagnetic energy may be microwave energy.

In some cases, the organic light emitting material may need to be shielded from the impinging electromagnetic energy by a mask, such as a metal mask placed between the color filter and the source of the irradiation. The first or second glass plate may be supported by a heated support and heated to a temperature greater than an ambient temperature, but less than about 100° C., either during any portion of the pre-sintering (evaporation of volatile organic and/or coalescing of the frit on the first glass plate) or while the hermetic seal is formed during the irradiation step. The pre-sintering process should be controlled so that a temperature of the glass-based frit is between about 325° C. and about 420° C.

In still another embodiment, a method of forming an organic light emitting diode device is disclosed comprising depositing a color filter on a first glass plate, the color filter comprising dyes or pigments, depositing a glass-based fit paste on the first glass plate as a loop circumscribing the color filter, forming an organic light emitting material on a second glass plate, positioning a resistive heating element in contact with the glass-based frit paste, flowing a electric current through the resistive heating element to heat the frit paste to a first temperature and drive off organic binders in the frit without densifying the fit paste, and varying a magnitude of the electric current through the resistive heating element to heat the fit to a second temperature greater than the first temperature, thereby densifying the frit. The method may further comprise forming an organic light emitting diode on a second glass plate, the organic light emitting diode comprising an organic light emitting material, aligning the first glass plate with the second glass plate in an overlapping relationship, and heating the glass-based frit with a laser to soften the glass based frit and form a hermetic seal between the first and second glass plates, wherein the color filter and the organic light emitting material are enclosed between the first and second glass substrates and the glass-based frit. The first glass plate may be heated via a heated support while a current is flowing through the resistive heating element.

The invention will be understood more easily and other objects, characteristics, details and advantages thereof will become more clearly apparent in the course of the following explanatory description, which is given, without in any way implying a limitation, with reference to the attached Figures. It is intended that all such additional systems, methods, features and advantages be included within this description, be within the scope of the present invention, and be protected by the accompanying claims.

DETAILED DESCRIPTION

In the following detailed description, for purposes of explanation and not limitation, example embodiments disclosing specific details are set forth to provide a thorough understanding of the present invention. However, it will be apparent to one having ordinary skill in the art, having had the benefit of the present disclosure, that the present invention may be practiced in other embodiments that depart from the specific details disclosed herein. Moreover, descriptions of well-known devices, methods and materials may be omitted so as not to obscure the description of the present invention. Finally, wherever applicable, like reference numerals refer to like elements.

As used herein a fit is defined as a glass-based material comprising an inorganic glass powder. The glass-based frit, or simply "frit", may optionally include one or more organic binders and/or an organic solvent as a vehicle. The frit may further include an inert, usually crystalline, material that serves to modify a coefficient of thermal expansion (CTE) of the fit. Thus, while the fit is primarily composed of a glass, it may also include other inorganic and organic materials. The frit may exist in various forms. For example, when the glass powder is mixed with organic binders and a vehicle the frit forms a paste. Heating of the frit at a temperature sufficient to drive off (evaporate) the volatile binders and vehicle but not sinter the frit may form a glass powder cake, wherein the glass powder is lightly bonded in a specific shape, but wherein the glass particles have not flowed. The cake may be easily disturbed. Heating at a higher temperature can cause the glass particles to flow and coalesce, thereby at least partially sintering the frit in a process step referred to as "pre-sintering". Additional heating at a sintering temperature can result in a complete coalescing of the glass particles, wherein the granular nature of the glass particles disappears, although any crystalline CTE-modifying constituents disposed in the fit may remain within the glass matrix.

As used herein, the term "frit glass" will be used to refer to the glass portion of the frit, excluding the vehicle, binders or CTE-modifying constituents.

As used herein, densifying or densification (also referred to as sintering) shall refer to the flowing and coalescing of the glass particulate comprising a frit.

As used herein, the term "pre-sintering" shall be used to denote the combined process of heating to drive off organic materials within a frit, and to causing at least partial densification of the frit glass. The driving off of organic material and densification of the fit glass may be performed in a single step, and therefore the term pre-sintering should not be construed to imply multiple steps (e.g. multiple heating steps).

Figure 1:
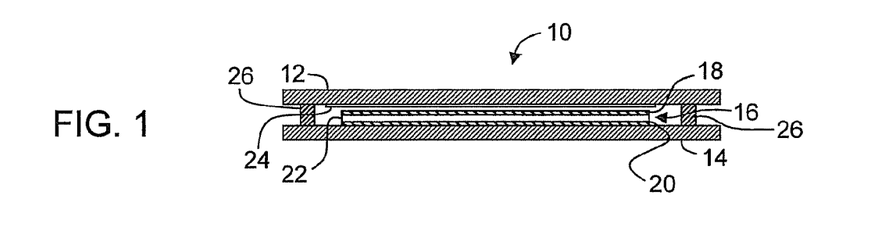
FIG. 1 is a cross sectional side view of an exemplary OLED device comprising a color filter.

FIG. 1 depicts an exploded view of an exemplary organic light emitting diode device 10 comprising first glass plate 12, second glass plate 14, and an organic light emitting diode 16 comprising a first electrode material 18, second electrode material 20 and one or more layers of organic light emitting material 22 disposed between the first and second electrode materials. Organic light emitting diode 16 may also comprise additional layers as needed (e.g. a hole injection layer). Also shown is color filter 24 disposed on first glass plate 12. Frit 26 is positioned between glass plates 12 and 14 and forms a hermetic seal between the first and second glass plates.

In a conventional OLED device sealing operation, a glass-based fit is deposited onto a first (cover glass) plate and pre-sintered in place by heating the cover glass-frit assembly in a furnace for a time and at a temperature sufficient to both drive off the organic materials in the frit and to densify the frit and attach the frit to the glass plate. For example, a typical sintering temperature can be in excess of 400° C. for at least about 15 minutes.

A color filter, such as color filter 24 of FIG. 1, comprises one or more color filter materials, often organic, comprising one or more layers, typically deposited as regions of primary color (e.g. red, green and blue), and together referred to as a color filter. Like the organic light emitting materials used in the formation of an OLED, color filter 24 can be sensitive to temperature, and may seriously degrade at temperatures in excess of about 100° C. Even an inorganic color filter may be compromised by the pre-sintering process. Thus, the practice of pre-sintering the fit onto a glass plate by heating the entire assembly in a furnace at a temperature above a temperature at which color filter materials degrade may be impractical where the temperature sensitive color filter has previously been deposited on the cover glass plate.

Accordingly, a method of producing a pre-sintered cover glass plate comprising a temperature sensitive material such as a color filter is disclosed without the drawbacks associated with furnace heating. In a first step of the method, a color filter 24 is deposited on a clean cover glass plate 12. The color filter material used to form the color filter may comprise a dye or it may comprise pigment, to produce red, green and blue color. The color filter material may be deposited by any conventional method depending on the material (dye or pigment), including but not limited to dyeing, diffusion, electro-deposition, and printing.

Next, a glass-based frit 26 is deposited onto the cover glass on the same side of the cover glass plate that the color filter material was deposited on. The frit may be deposited, for example, as a paste that is extruded from a nozzle. The frit may also be deposited by screen printing if desired. The glass-based frit is deposited in the form of a closed frame or loop that circumscribes the color filter material. The deposited frit comprises a width "w" that is the width of the line of material at any point along the loop of fit. Once the glass-based frit has been deposited, the loop of glass-based frit is heated to drive out organic binders in the frit and to at least partially sinter the frit so that it maintains its shape and adheres tightly to the cover glass plate.

Figure 2:
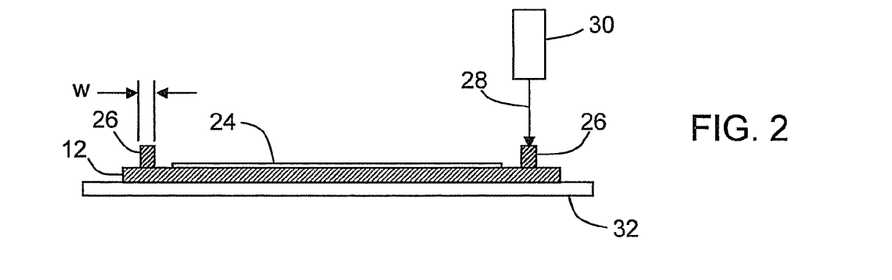
FIG. 2 is a cross sectional side view of a cover glass plate comprising a loop of frit, wherein the frit is irradiated with a laser beam to pre-sinter the fit.

As shown in FIG. 2, once color filter 24 and frit loop 26 are positioned, the loop of glass based frit is heated with a laser beam 28 emitted by laser 30 by traversing the beam over the frit loop. The beam may irradiate the fit directly, or the beam may be applied to the fit from the glass plate side, wherein the beam first passes through the glass plate before impinging on the frit. The glass plate, the fit and the laser are selected so that the glass plate does not significantly absorb light at the wavelength, or range of wavelengths, emitted by the laser. That is, the plate may be selected to be substantially transparent at the wavelengths of light emitted by laser 30. For example, laser 30 may emit light at a wavelength in the range between about 500 nm and 1200 nm. For many experiments, a wavelength of 810 nm was successfully used.

Laser 30 can be configured with appropriate optical elements (e.g. lenses and/or reflectors—not shown) to produce a narrow beam that selectively heats the loop of glass based frit 26 without significantly heating color filter 24. That is, the color filter material does not exceed a temperature greater than about 100° C., preferably no more than about 80° C., during the heating of the frit, even though the diameter of the laser beam may exceed the width of the glass-based frit loop. In some embodiments, the beam diameter was about 5.6 mm, and larger than the width of the frit line width. This ensures the uniformity of sintering across the fit width. Preferably, the diameter of laser beam 28 is greater than the width of the frit to ensure sintering across the width of the frit. Should the diameter of the laser beam be less than a width of the frit, multiple passes with the beam may be utilized. For example, the beam may be traversed along the loop in a first pass, offset an amount sufficient to overlap the un-sintered portion of the frit, and traversed along the loop in a second pass. Multiple passes may be required to pre-sinter the frit across its width. The laser beam may comprise a Gaussian power profile (the profile across the diameter of the beam orthogonal to the longitudinal axis of the beam), a flat top profile, parabolic, or any other shape.

In a variation of the method above, the frit may initially be heated at a low temperature by first adjusting the power of the laser so that volatile organic binders are removed from the frit without densifying the frit, after which the laser power may be increased to initiate densification of the frit.

The cover plate may also be heated in bulk to improve the pre-sintering process. That is, the cover plate may first be heated on heated support 32, such as a heating pad or plate, to assist in reducing stress in the glass. The heating can also aid in driving off low vapor pressure volatile materials prior to exposure of the fit to the laser. Heating the cover plate with a heating plate while pre-sintering can also aid in preventing volatilized components of the frit binders from re-depositing on the cover plate, and may therefore be used in conjunction with the laser. For example, the cover plate may be heated to a temperature between 120° C. and 150° C.

The scanning, or traverse speed, selected for the laser depends on the power output of the laser, the beam diameter, the wavelength of the beam and the frit absorption coefficient. For example, using 810 nm laser, when the beam diameter is 3.5 mm, the scanning speed is 2 mm/s with a power of 14 watts; with a beam diameter of 5.66 mm, the power is about 45 watts at 2 mm/s. The equation covering densification of the frit during the pre-sintering operation is given below:

$$\rho_F = \rho(0)\left(1 - \frac{3\gamma t k_s}{8\mu(t)r}x_f\right)^{-3} \qquad (1)$$

Where, $\rho_F$ is the final density of the frit, $\rho(0)$ is the initial relative density of the frit, $\gamma$ is glass-vapor surface tension, $\mu$ is glass viscosity, $k_s$ is a empirical shape factor, and $x_f$ is the fraction of the frit surface area available for sintering.

The glass-based frit comprises one or more metal oxide components, and preferably comprises at least one transition metal that enhances the absorption of the fit at a wavelength, or in a wavelength range, emitted by the laser. For example, lasers emitting in the infrared (IR) region of the electromagnetic spectrum are readily obtained. Consequently, the glass-based fit may include vanadium and/or iron oxides in amounts effective to produce IR absorption sufficient to result in significant heating of the frit when exposed to IR light.

The glass based fit may or may not include inert fillers that modify the coefficient of thermal expansion of the frit glass. For example, in many applications it is preferred that the CTE of the sealing material substantially match the pieces to be joined by the sealing material. Depending on the composition of the fit glass, an inert modifying agent, such as beta eucryptite, may be added to the fit glass to lower the CTE of the overall glass-based frit so that it matches the CTE of the glass plates to be joined. For example, glass plates popular for use in OLED applications typically have a CTE in the range of about $30 \times 10^{-7}/°$ C. to about $40 \times 10^{-7}/°$ C. On the other hand, the CTE of many fit glasses have CTE's above $90 \times 10^{-7}/°$ C. Thus, it may be necessary to lower the CTE of the frit glass by adding a CTE modifier. Of course in some cases an appropriate CTE can be attained without the use of a CTE modifier by adjusting the frit glass constituents.

The glass-based frit also comprises one or more organic binders and usually an organic solvent that acts a vehicle for the frit. In its un-sintered state, the glass-based fit is preferably a paste, although a frit powder not employing binders or a vehicle may be used.

In some embodiments, less expensive glass plates may be employed, such as those employing soda lime glass. A typical CTEs of soda lime glass plates are higher than $40 \times 10^{-7}/°$ C., and may exceed $90 \times 10^{-7}/°$ C. In these instances, a CTE modifier may not be necessary. In still other instances, a large CTE difference (e.g. $10 \times 10^{-7}/°$ C. or more) between the frit and the glass plates can be accommodated by adjusting the parameters of the sealing process, including ambient temperature of the glass plate.

Figure 3:
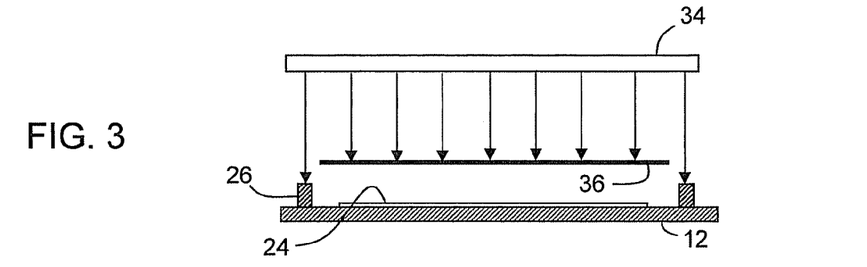
FIG. 3 is a cross sectional side view of a cover glass plate comprising a loop of frit, wherein the fit is irradiated with a broadband IR light emitted by a lamp to pre-sinter the frit.

In another embodiment shown in FIG. 3, laser 30 may be replaced by IR lamp 34. Similar to embodiments employing a laser, IR lamp 34 should emit light comprising a wavelength readily absorbed by the glass-based frit. The organic vehicle can be first driven out using a laser beam or heating pad as disclosed above, or directly using IR radiation from one or more IR lamps. Because the spatial light output of a lamp can be much larger than the beam width of a laser, steps should be taken to protect color filter 24 from the lamp output. For example, the light output of the lamp may be collimated and focused so that the area of the focused beam irradiating the frit is on the order of the diameter of the laser beam from the prior embodiment. For example, about 3 mm.

A simpler approach to preventing exposure of the color filter to IR light is to employ mask 36, such as a metallic mask, between the lamp and the glass cover plate that blocks light that would otherwise irradiate color filter 24, but still allows IR light to irradiate the frit. Mask 36 may operate by absorbing the light, reflecting the light, or both absorbing and reflecting. Frit 26 can be exposed to the IR light emitted by the IR lamp uniformly (the entire frit loop at the same time, as shown in FIG. 3) or be mounted on a traveling system to expose the energy to frit locally by traversing the fit with a beam of limited size (such as by modifying the lamp output with lenses, reflectors, beam blockers, etc.).

By adjusting the power output of the IR lamp or lamps 34, frit 26 can first be heated to drive out the organic binders according to the methods described above. The exposure time for densification can be determined according to Equation 1. Preferably, the temperature of the frit during the binder removal phase is around 325° C., and the fit densification temperature between 325° C. and 420° C., more preferably between 390° C. and 410° C. Because the area of glass plate 12 adjacent to the frit is not directly heated by the IR radiation (for example, by masking off the color filter), the temperature adjacent the fit is much lower than the temperature of the frit, preferably less than about 100° C.

Figure 4:
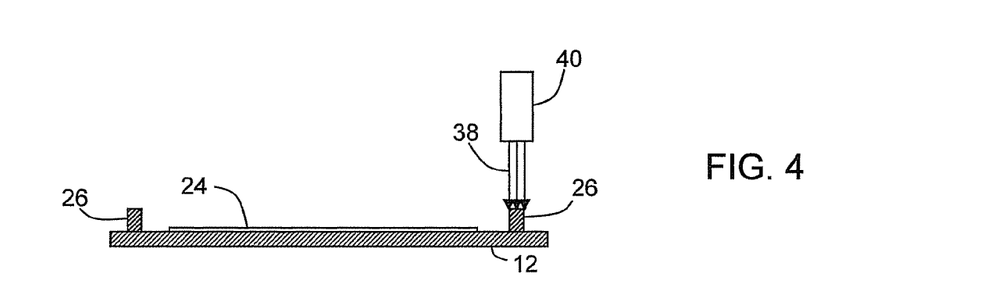
FIG. 4 is a cross sectional side view of a cover glass plate comprising a loop of frit, wherein the fit is irradiated with microwave energy to pre-sinter the frit.

In still another embodiment depicted in FIG. 4, microwaves energy 38 emitted by microwave generator 40 may be used to heat the fit loop disposed on cover plate 12. Preferably, the output of the microwave generator is sufficiently small that it may be used to heat the fit without shielding to protect the color filter material. If not, a mask or other shielding (not shown) may be disposed between the output of the microwave generator and the color filter to prevent irradiation of the color filter. In any event, as before, the color filter material should not be allowed to be heated above a temperature of about 100° C., preferably not above 80° C.

By adjusting the power output of microwave generator 40, fit 26 can first be heated to drive out the organic binders without frit densification, and then, after the organic binders are gone, increasing the power to raise the frit temperature and densify the frit. Alternatively, a laser IR lamp or an oven (operated at a temperature below the thermal degradation temperature of the color filter material) may be used to drive off the organic binders in the fit. The exposure time for densification can be determined according to Equation 1. Preferably, the temperature of the frit during the binder removal phase is around 325° C., and the fit densification temperature between 325 and 420° C., more preferably 390° C. and 410° C.

Figure 5:
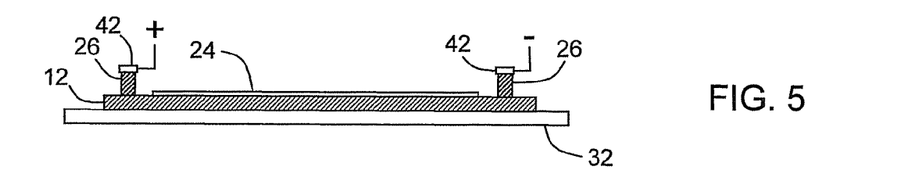
FIG. 5 is a cross sectional side view of a cover glass plate comprising a loop of frit, wherein a resistive heating element is disposed over the frit to pre-sinter the frit.
Figure 6:
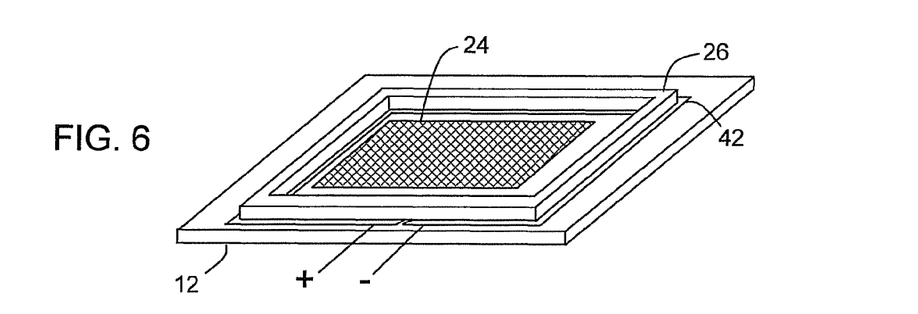
FIG. 6 is a perspective view of a cover glass plate comprising a loop of frit, wherein a resistive heating element is disposed between the cover glass plate and the frit to pre-sinter the frit.

In yet another embodiment, frit 26 may be pre-sintered by resistively heating the frit, as shown in FIG. 5. FIG. 5 depicts glass cover plate 12 comprising color filter 24 and a loop of glass-based frit 26. A resistive element 42 connected to an electrical voltage source is placed in contact with the frit, either by positioning the resistive element overtop of the frit loop as shown in FIG. 5, or the resistive element may first be deposited on the cover glass plate and the frit deposited overtop the resistive element as indicated in FIG. 6. In the latter case, care should be taken to ensure that the resistive element is well adhered to the cover plate since the resistive element will become part of the seal between glass plates 12 and 14. Resistive element 42 may be, for example, SiC, $MoSi_2$, tungsten, Kovar alloy, Nickel, Molybdenum, graphite or other materials. The voltage may be varied to vary the average current flowing through resistive element 42, and thereby varying a temperature of the frit. The current may be an alternating current or a direct current. For example, an initial voltage may be set to produce a initial low temperature in frit 26. For example, the initial low temperature may be between about 300° C. and about 325° C. to drive off the organic binders in the fit. Thereafter, the voltage can be increased to increase the current flow and the temperature of the fit. For example, a temperature between about 325° C. and 420° C., more preferably between 390° C. and 410° C. has been found suitable to densify the fit some frit compositions. If desired, the frit temperature may be directly measured using an IR camera during the pre-sintering step.

Figure 7:
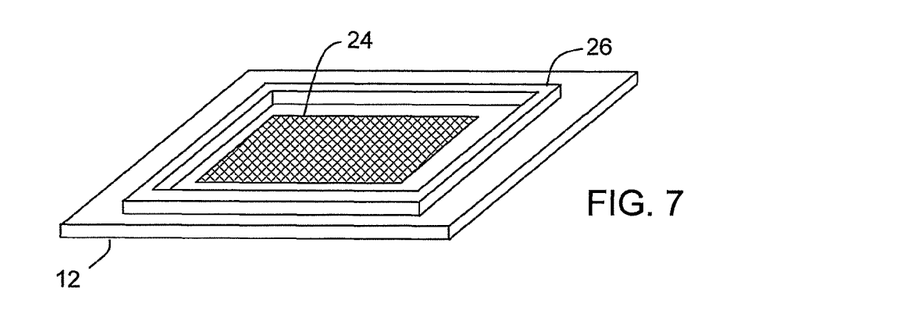
FIG. 7 is a perspective view of a cover glass plate comprising a color filter and a loop of pre-sintered glass based frit deposited thereon.

The pre-sintering step as conducted by any of the methods described above results in a glass substrate comprising a densified wall or loop of fit and a color filer material disposed within the perimeter of the pre-sintered frit, as illustrated in FIG. 7.

Figure 8:
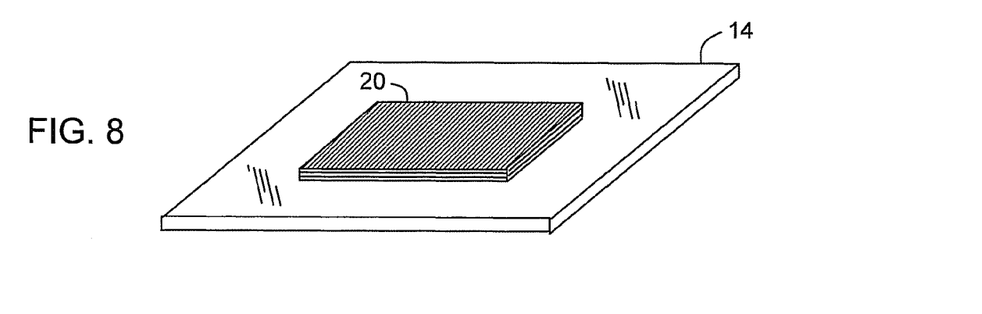
FIG. 8 is a perspective view of a second glass plate comprising an organic light emitting material deposited thereon.
Figure 9:
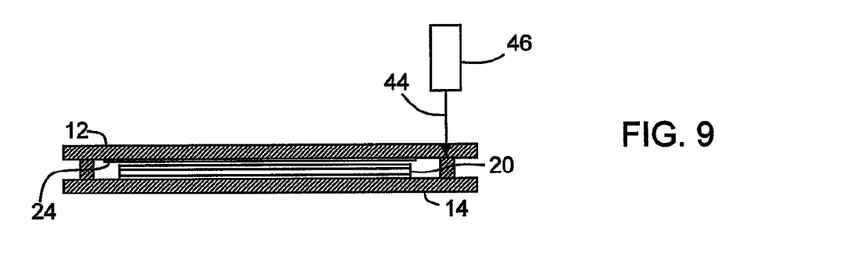
FIG. 9 is a cross sectional side view of the OLED device of FIG. 1 being hermetically sealed with a laser.

Whether the glass-based frit is pre-sintered using a laser (FIG. 2), an IR lamp (FIG. 3), microwave energy (FIG. 4), or by resistively heating the frit (FIGS. 5 and 6), once the fit has been pre-sintered and adhered to the cover plate, the cover plate and the backplane plate comprising the light emitting organic material (FIG. 8) are aligned, preferably in an inert atmosphere (such as in a suitably sized glove box having a controlled atmosphere) so that when the two plates are brought together, both the organic light emitting material and the organic color filter material are encompassed by the cover plate, the backplane plate and the frit loop. That is, the backplane, the cover plate and the frit form a cavity containing the organic materials. The fit loop can then be re-heated as shown in FIG. 9 to soften the loop so that the loop adheres both to the cover plate and the backplane plate. When the glass-based frit loop cools, it forms a hermetic seal between the two glass plates that protects the organic materials within the resultant glass package from exposure to oxygen and moisture.

A preferred method of hermetically sealing the cover and backplane substrates is by irradiating the frit positioned between glass plates 12 and 14 with a laser beam 44 emitted by a sealing laser 46. Preferably, the glass of the plates does not absorb significant light at the wavelength or range of wavelengths over which the glass-based frit absorbs so that beam 44 passes through the glass plates substantially unattenuated. This prevents heating of the plates that might interfere with the heating of the fit or lead to damage to the organic materials. In other words, it is preferred that cover plate 12 and backplane 14 are substantially transparent at the wavelength or wavelength output by the sealing laser 46. The beam output by the laser is traversed over the frit to soften the frit and adhere it to both the cover and backplane glass plates, thereby forming the hermetic seal between them.

Figure 10:
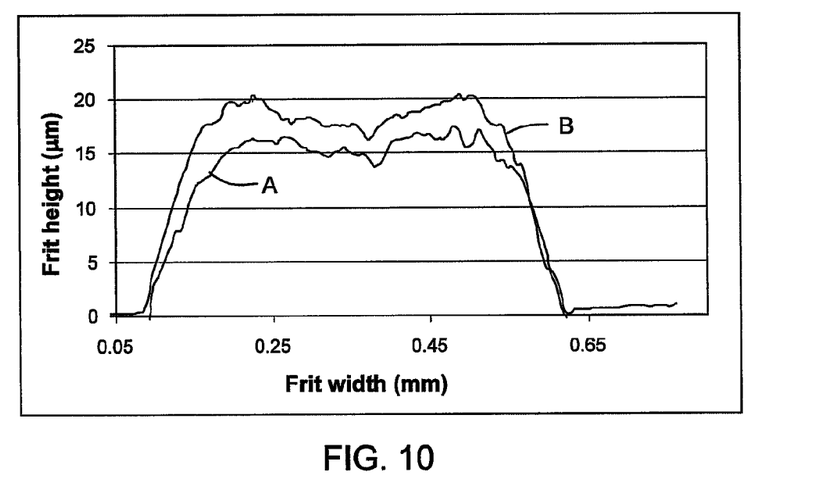
FIG. 10 is a cross sectional profile of a fit line pre-sintered according to an embodiment of the present invention and showing both before and after profiles.
Figure 11:
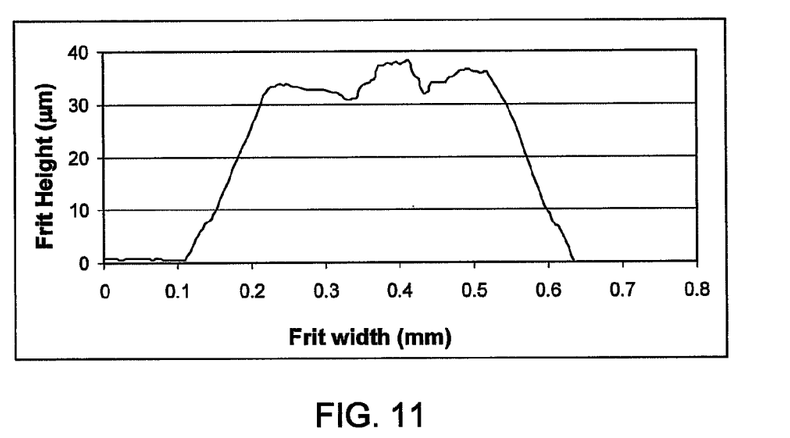
FIG. 11 is a cross sectional profile of a frit line that has been pre-sintered at a high temperature, showing expansion of the frit, and an increase in frit height.

FIG. 10 depicts a cross sectional fit height both before (curve B) and after (curve A) laser pre-sintering to a substrate. The laser beam can scan along the frit length with different speeds. In this example, the traverse speed of the laser was about 2 mm/s, and the power was about 37-41 watts. As shown, the frit height was reduced after heating by the laser sintering, indicating sintering (coalescing) of the frit particles as the fit was heated by the laser beam. The pre-sintering process closes pores in the frit, thereby improving the integrity of the structure. Due to the longer resident time at the corners of the frit pattern, the power of the laser beam is reduced at the corners, to about 34 watts, to ensure uniform pre-sintering quality along the frit. At higher power, the frit can be overheated, and the gas-filled pores in the frit grow due to the fast expansion of the gas. This can be seen in FIG. 11, where it can be seen that pore growth leads the frit to "grow" in height, an undesirable result.

Figure 12:
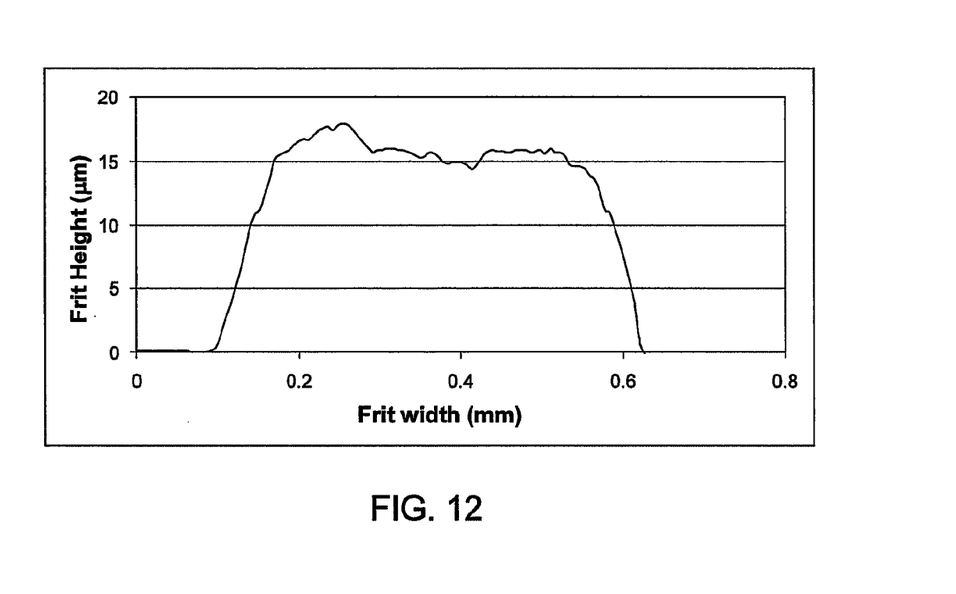
FIG. 12 is another cross sectional profile of a frit line pre-sintered according to an embodiment of the present invention.

Pre-sintering can be also achieved at a higher traverse speed, for example at 10 mm/s. A cross sectional profile of the frit after pre-sintering at laser beam power of 60 watts with a 28.2 mm defocus is shown in FIG. 12. The laser beam in this example had a diameter of about 5.4 mm. The speed can be even higher if a higher laser power is used.

Figure 13:
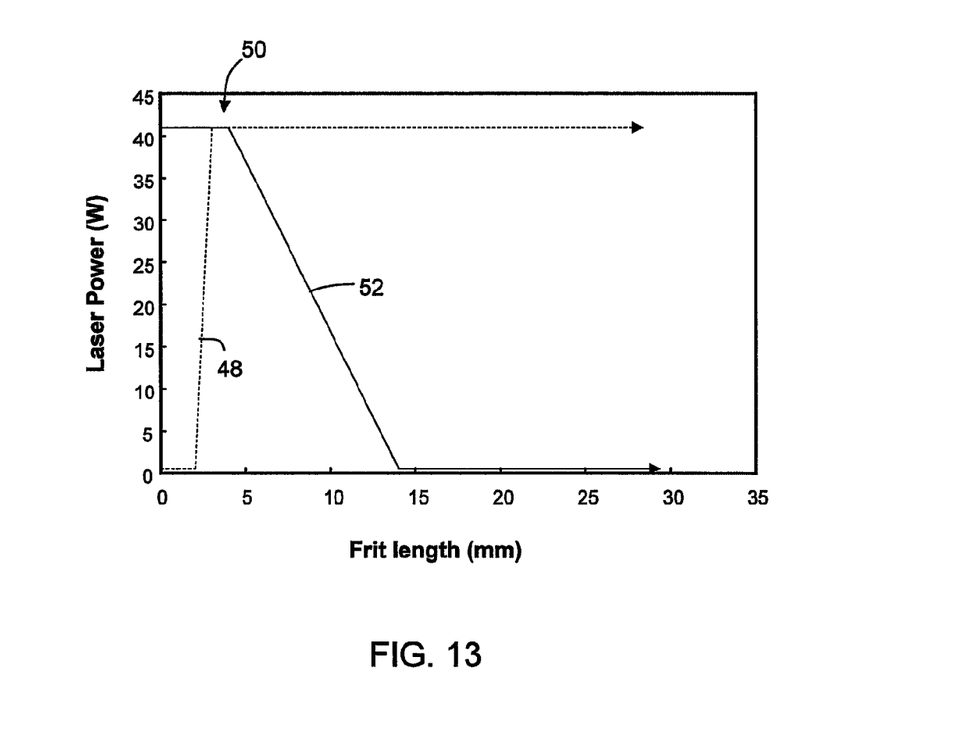
FIG. 13 is an exemplary laser beam power schedule for pre-sintering fit to a glass cover plate according to an embodiment of the present invention.

Care should be exercised both at the laser beam start and slop points to avoid frit cracking. When the laser starts, ramp-up of the laser power to a final power should be done over a very short distance, about 1 mm or less, to avoid frit cracking. An exemplary pre-sintering schedule (depicted in turns of laser beam power as a function of distance over the frit) is shown in FIG. 13. If there is a slow power ramp-up, only a small part of the fit is sintered in the ramp-up region and there is danger the boundary between sintered frit and non-sintered fit will develop a crack. A fast power ramp-up (curve 48) ensures uniform sintering from the beginning to the end of the process. When the laser returns to the starting point (laser stop), there is about 1 mm positive overlap (area 50) on the previously sintered frit, and then the power slowly ramps down (curve 52). This leads to a consistent appearance and quality of the sintered frit at the laser start/stop region as is exhibited at other areas on the sintered frit.

Once a fitted cover plate comprising a color filter material has been pre-sintered, the cover plate can then be sealed to a backplane comprising organic light emitting material. For example, the cover plate can be placed over a backplane with the fit positioned between the cover and the backplane. The frit is then heated with a laser beam to soften the fit and adhere it to both the cover plate and the backplane. For example, a suitable sealing speed is 20 mm/s, at a laser beam power of about 28 watts. When the fit cools, it forms a hermetic seal between the cover and backplane plates.

It should be emphasized that the above-described embodiments of the present invention, particularly any "preferred" embodiments, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A method of forming an organic light emitting diode device (10) comprising:
    depositing a color filter (24) on a first glass plate (12), the color filter comprising dyes or pigments that produce a primary color in the color filter;
    depositing a glass-based frit (26) on the first glass plate as a loop circumscribing the color filter; and
    irradiating the glass-based frit with electromagnetic radiation to densify the glass-based frit on the first glass plate.

2. The method according to claim 1, further comprising heating the glass-based frit to remove organic binders in the glass-based frit without densifying the frit glass.

3. The method according to claim 2, wherein the heating comprises heating the first glass plate on a heated support (32).

4. The method according to claim 1, further comprising heating the first glass plate on a heated support during the irradiating.

5. The method according to claim 1, wherein the irradiation comprises irradiating the glass-based frit with microwaves.

6. The method according to claim 1, wherein the irradiation comprises irradiating the glass-based frit with IR light.

7. The method according to claim 1, further comprising:
    depositing an organic light emitting material (22) on a second glass plate (14);
    aligning the first glass plate (12) with the second glass plate (14) in an overlapping relationship; and
    heating the glass-based frit (26) with a laser (46) to soften the glass-based frit and form a hermetic seal between the first and second glass plates, wherein the color filter (24) and the organic light emitting material (22) are enclosed between the first and second glass substrates and the glass-based frit.

8. A method of forming an organic light emitting diode device (10) comprising:
    depositing a color filter (24) on a first glass plate (12);
    depositing a glass-based frit (26) on the first glass plate as a loop circumscribing the color filter;
    depositing an organic light emitting material (22) on a second glass plate (14);
    impinging electromagnetic radiation on the glass-based frit to densify the glass-based frit on the first glass plate;
    aligning the first glass plate with the second glass plate in an overlapping relationship; and
    heating the glass-based frit with a laser (46) to soften the glass based frit and form a hermetic seal between the first and second glass plates, wherein the color filter and the organic light emitting material are enclosed between the first and second glass substrates and the hermetic seal.

9. The method according to claim 8, wherein the electromagnetic radiation is light energy comprising a wavelength between about 500 nm and 1200 nm.

10. The method according to claim 9, wherein the light energy comprises a laser beam.

11. The method according to claim 10, wherein a width of the laser beam is greater than a width of the glass-based frit.

12. The method according to claim 9, wherein the light energy is broadband IR light emitted by an IR lamp.

13. The method according to claim 8, wherein the electromagnetic energy is microwave energy.

14. The method according to claim 8, wherein the color filter (24) comprises dyes or pigments that produce one or more primary colors.

15. The method according to claim 8, wherein the organic light emitting material (22) is shielded from the impinging electromagnetic energy by a mask 36.

16. The method according to claim 8, wherein the first or second glass plate is supported by a heated support (32) and heated to a temperature greater than an ambient temperature, but less than about 100° C. while the hermetic seal is formed.

17. The method according to claim 8, wherein a temperature of the glass-based frit (26) during the impinging with electromagnetic energy is between about 325° C. and about 420° C.

18. A method of forming an organic light emitting diode device (10) comprising:
    depositing a color filter (24) on a first glass plate (12), the color filter comprising dyes or pigments;
    depositing a glass-based frit paste (26) on the first glass plate as a loop circumscribing the color filter;
    positioning a resistive heating element (42) in contact with the glass-based frit paste;
    flowing an electric current through the resistive heating element to heat the frit paste to a first temperature and drive off organic binders in the frit without densifying the glass-based frit paste; and
    varying a magnitude of the electric current through the resistive heating element to heat the glass-based frit paste to a second temperature greater than the first temperature, thereby densifying the glass-based frit paste.

19. The method according to claim 18, further comprising:
    forming an organic light emitting material on a second glass plate;
    aligning the first glass plate with the second glass plate in an overlapping relationship; and
    heating the densified glass-based frit paste with a laser to soften the glass-based frit and form a hermetic seal between the first and second glass plates, wherein the color filter and the organic light emitting material are enclosed between the first and second glass substrates and the hermetic seal.

20. The method according to claim 18, further comprising heating the first glass plate on a heated support while a current is flowing through the resistive heating element.

* * * * *